US 11,424,355 B2

(12) United States Patent
Dellas

(10) Patent No.: US 11,424,355 B2
(45) Date of Patent: Aug. 23, 2022

(54) METHOD OF MAKING A HIGH POWER TRANSISTOR WITH GATE OXIDE BARRIERS

(71) Applicant: Texas Instruments Incorporated, Dallas, TX (US)

(72) Inventor: Nicholas Stephen Dellas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 534 days.

(21) Appl. No.: 15/466,918

(22) Filed: Mar. 23, 2017

(65) Prior Publication Data

US 2017/0194472 A1 Jul. 6, 2017

Related U.S. Application Data

(62) Division of application No. 14/531,575, filed on Nov. 3, 2014, now Pat. No. 9,640,620.

(51) Int. Cl.
*H01L 29/66* (2006.01)
*H01L 29/778* (2006.01)
*H01L 29/40* (2006.01)
*H01L 29/20* (2006.01)
*H01L 21/28* (2006.01)
(Continued)

(52) U.S. Cl.
CPC .... *H01L 29/7786* (2013.01); *H01L 21/28264* (2013.01); *H01L 23/291* (2013.01); *H01L 29/1066* (2013.01); *H01L 29/2003* (2013.01); *H01L 29/401* (2013.01); *H01L 29/513* (2013.01); *H01L 29/66462* (2013.01); *H01L 29/7781* (2013.01)

(58) Field of Classification Search
None
See application file for complete search history.

(56) References Cited

U.S. PATENT DOCUMENTS 4,291,327 A * 9/1981 Tsang ............... H01L 21/02178
257/E21.29
5,180,681 A 1/1993 Mishra et al.
(Continued)

FOREIGN PATENT DOCUMENTS

CN 101521225 A 9/2009
WO WO2010151857 A9 12/2010
(Continued)

OTHER PUBLICATIONS

P.D. Ye, et al., "GaN Metal-Oxide-Semiconductor High-Electron-Mobility-Transistor With Atomic Layer Deposited Al2O3 as Gate Dielectric", Applied Physics Letters 86, pp. 063501-1-063501-3 (2005).
(Continued)

*Primary Examiner* — Bilkis Jahan
(74) *Attorney, Agent, or Firm* — Jacqueline J. Garner; Charles A. Brill; Frank D. Cimino

(57) ABSTRACT

A method of fabricating a gate stack for a power transistor device includes thermally oxidizing a surface of a Group IIIA-N layer on a substrate to form a first dielectric layer of an oxide material that is >5 A thick. A second dielectric layer being silicon nitride or silicon oxynitride is deposited on the first dielectric layer. A metal gate electrode is formed on the second dielectric layer.

19 Claims, 2 Drawing Sheets

(51) Int. Cl.
*H01L 23/29* (2006.01)
*H01L 29/51* (2006.01)
*H01L 29/10* (2006.01)

(56) References Cited

U.S. PATENT DOCUMENTS

| | | | | |
|---|---|---|---|---|
| 6,063,698 A * | 5/2000 | Tseng | ................ | H01L 21/28176 |
| | | | | 257/E21.194 |
| 8,633,094 B2 | 1/2014 | Ramdani et al. | | |
| 8,822,282 B2 | 9/2014 | Fitzgerald | | |
| 2002/0146864 A1* | 10/2002 | Miyaki | ............. | H01L 23/49503 |
| | | | | 438/123 |
| 2004/0227153 A1* | 11/2004 | Hirose | ............... | H01L 21/28581 |
| | | | | 257/192 |
| 2004/0238860 A1 | 12/2004 | Inoue et al. | | |
| 2006/0138456 A1 | 6/2006 | Parikh et al. | | |
| 2010/0012977 A1* | 1/2010 | Derluyn | ............ | H01L 29/66431 |
| | | | | 257/194 |
| 2011/0089467 A1 | 4/2011 | Chang et al. | | |
| 2011/0101370 A1* | 5/2011 | Cheng | ............... | H01L 21/02422 |
| | | | | 257/76 |
| 2011/0186855 A1* | 8/2011 | Ramdani | ........... | H01L 21/28264 |
| | | | | 257/76 |
| 2012/0091522 A1 | 4/2012 | Dzaki et al. | | |
| 2012/0205717 A1* | 8/2012 | Kurahashi | ......... | H01L 29/42316 |
| | | | | 257/194 |
| 2012/0228723 A1* | 9/2012 | Wang | ................ | H01L 21/28202 |
| | | | | 257/410 |
| 2013/0062742 A1* | 3/2013 | Warren | ............. | H01L 23/49582 |
| | | | | 257/666 |
| 2013/0087803 A1* | 4/2013 | Kizilyalli | .......... | H01L 29/66462 |
| | | | | 257/76 |
| 2013/0299842 A1 | 11/2013 | Prechtl et al. | | |
| 2014/0091308 A1 | 4/2014 | Dasgupta | | |
| 2014/0159117 A1* | 6/2014 | Taniguchi | ........... | H01L 29/4232 |
| | | | | 257/194 |
| 2014/0183598 A1* | 7/2014 | Chiu | ................... | H01L 29/4236 |
| | | | | 257/190 |
| 2014/0224534 A1* | 8/2014 | Kubota | ............. | H01L 23/49524 |
| | | | | 174/520 |
| 2014/0239309 A1 | 8/2014 | Ramdani et al. | | |
| 2014/0264383 A1* | 9/2014 | Kajiwara | ............... | H01L 23/293 |
| | | | | 257/77 |
| 2014/0264451 A1* | 9/2014 | Ozaki | ................. | H01L 29/7786 |
| | | | | 257/194 |
| 2014/0264453 A1* | 9/2014 | Moens | ............. | H01L 29/66462 |
| | | | | 257/194 |
| 2014/0332855 A1* | 11/2014 | Cheng | ................ | H01L 29/0847 |
| | | | | 438/197 |
| 2016/0372587 A1* | 12/2016 | Tsuchiya | ............ | H01L 29/7787 |

FOREIGN PATENT DOCUMENTS

| | | |
|---|---|---|
| WO | WO2011046844 A1 | 4/2011 |
| WO | WO2013095345 A1 | 6/2013 |

OTHER PUBLICATIONS

B. Gaffey, et al., "High-Quality Oxide/Nitride/Oxide Gate Insulator for GaN MIS Structures", IEEE Transactions on Electron Devices, vol. 48, No. 3, Mar. 2001, pp. 458-464.

International Search Report in corresponding PCT Application No. PCT/US2015/058866, dated Feb. 11, 2016 (2 pages).

* cited by examiner

METHOD OF MAKING A HIGH POWER TRANSISTOR WITH GATE OXIDE BARRIERS

CROSS-REFERENCE TO RELATED APPLICATIONS

Under 35 U.S.C. §§ 120, 121, this divisional application claims priority to and benefits of U.S. patent application Ser. No. 14/531,575 (TI-74089), filed on Nov. 3, 2014, the entirety of which are hereby incorporated herein by reference.

FIELD

Disclosed embodiments relate to Group IIIA-N (e.g., GaN) field effect transistors (FETs), and more particularly to gate stacks for such FETs.

BACKGROUND

Gallium-nitride (GaN) is a commonly used Group IIIA-N material, where Group IIIA elements such as Ga (as well as boron, aluminum, indium, and thallium) are also sometimes referred to as Group 13 elements. GaN is a binary IIIA/V direct bandgap semiconductor that has a Wurtzite crystal structure. Its relatively wide band gap of 3.4 eV at room temperature (vs. 1.1 eV for silicon) affords it special properties for a wide variety of applications in optoelectronics, as well as high-power and high-frequency electronic devices.

One of the major factors that can limit the performance and reliability of Group IIIA-N based high-electron-mobility-transistors (HEMTs) is their relatively high gate leakage. The gate leakage can reduce the breakdown voltage and the power-added efficiency while increasing the noise figure. To help reduce the gate leakage problem, some have changed the gate dielectric material from conventional SiN or SiON or to other dielectric materials, or to multi-layer gate dielectric stacks.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for a Group IIIA-N transistor device there may be relatively high gate leakage when using SiN or SiON gate dielectrics on Group IIIA-N materials such as GaN or AlGaN. For example, gate dielectrics deposited directly on GaN can have high interface trap state densities. Additional thermal treatments before and after gate dielectric deposition can help reduce gate leakage somewhat to help enable better performance of GaN field effect transistors (FETs), but the reduction is recognized herein to not be sufficient for some applications.

Disclosed embodiments describe methods of fabricating a multi-layer gate dielectric for a power Group IIIA-N transistor device that includes thermally oxidizing the surface of a Group IIIA-N layer that is on a substrate to form a first dielectric layer comprising an oxide material having a thickness >5 A (Angstroms). A second dielectric layer comprising silicon nitride or silicon oxynitride is then deposited on the first dielectric layer. A gate electrode is then formed on the second dielectric layer.

BRIEF DESCRIPTION OF THE DRAWINGS

Reference will now be made to the accompanying drawings, which are not necessarily drawn to scale, wherein.

DETAILED DESCRIPTION

Figure 1:
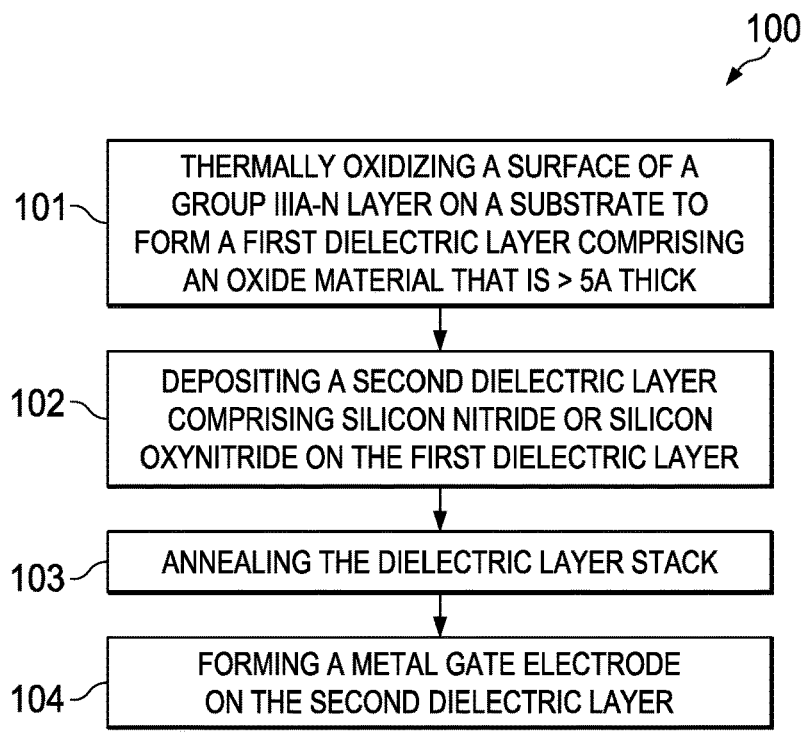
FIG. 1 is a flow chart that shows steps in an example method of fabricating a multi-layer gate dielectric stack for a power Group IIIA-N transistor device, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of fabricating a multi-layer gate dielectric stack for a Group IIIA-N power transistor device, according to an example embodiment. In a typical fabrication process an undoped buffer layer (e.g., a 40 nm undoped AlN buffer layer) followed by a Group IIIA-N layer (e.g., a 3 µm undoped GaN layer) followed by another Group IIIA-N layer that functions as an active layer (e.g., a 30 nm undoped AlGaN layer) are sequentially grown by metal-organic chemical vapor deposition (MOCVD) on a substrate.

Step 101 comprises thermally oxidizing the surface of a Group IIIA-N layer on a substrate to form a first dielectric layer comprising an oxide material that is >5 A thick. The thermally oxidizing can include a rapid thermal oxidation (RTO) at 500° C. to 900° C. for a time from 30 sec to 30 minutes, in an oxidizing ambient such as $O_2$, or can be a furnace oxidation at 500° C. to 900° C. in an oxygen comprising ambient for a time of 30 seconds up to 1 hour. The RTO is performed in a temperature range from 700° C. to 850° C. in one embodiment.

Step 101 may also comprise an in-situ oxidation, such as using air or an oxygen ambient before a SiN or SiN low pressure chemical vapor deposition (LPCVD, see step 102 described below). The oxidation product is generally a gallium oxide such as $Ga_2O_3$ or an alloy of $Ga_2O_3$ and $Me_2O_3$ ($Ga_xMe_yO_3$), where Me may be Al and/or In depending on the composition of the Group IIIA-N layer. The gate dielectric thickness range after step 101 is generally 5 A to 5 nm, typically being 1 nm to 2.5 nm.

The substrate can comprise substrates such as sapphire, silicon or silicon carbide (SiC). The Group IIIA-N layer may be represented by the general formula $Al_xGa_yIn_{1-x-y}N$, where $0 \le x \le 1$, $0 \le y \le 1$, $0 \le x+y \le 1$. For example, the Group IIIA-N layer can comprise at least one of GaN, InN, AlN, AlGaN, AlInN, InGaN, and AlInGaN. Other Group IIIA elements such as boron (B) may be included, and N may be partially replaced by phosphorus (P), arsenic (As), or antimony (Sb). Each of the Group IIIA nitride compound semiconductors may contain an optional dopant selected from Si, C, Ge, Se, O, Fe, Mn, Mg, Ca, Be, Cd, and Zn. The Group IIIA-N layer(s) may be formed by processes including MBE, MOCVD or HVPE.

Step 102 comprises depositing a second dielectric layer comprising silicon nitride or silicon oxynitride on the first dielectric layer. The oxide material formed in step 101 can be converted into SiOx or SiOxNy, with the silicon and nitrogen coming from the second dielectric layer providing a silicon source for the conversion.

Step 103 comprises an optional anneal, such as from 800 to 1100° C. generally in $N_2$ (or other non-oxidizing gas) after depositing the second dielectric layer (step 102).

The gate dielectric stack on the source and drain regions is removed while the gate region is generally protected by the photoresist. Ohmic contacts are then formed, such as by sputtering a metal stack such as Ti/Al/TiN. Step 104 comprises forming gate electrodes, such as using a TiW alloy to form the gate electrodes.

One example of a power semiconductor device that can utilize disclosed multi-layer gate dielectric embodiments is a HEMT. A HEMT, also known as heterostructure FET (HFET) or modulation-doped FET (MODFET), is a field-effect transistor incorporating a junction between two semiconductor materials with different band gaps (i.e. a heterojunction) as the channel instead of a doped region (as is generally the case for a metal-oxide-semiconductor field-effect transistor (MOSFET)). The HEMT includes a 2DEG used as a carrier in a channel layer. Since the 2DEG is used as a carrier, the electron mobility of the HEMT is higher than that of other general transistors. The HEMT includes a compound semiconductor having a wide band gap. Therefore, a breakdown voltage of the HEMT may be greater than that of other general transistors. The breakdown voltage of the HEMT may increase in proportion to a thickness of the compound semiconductor layer including the 2DEG, for example, a GaN layer.

Figure 2A:
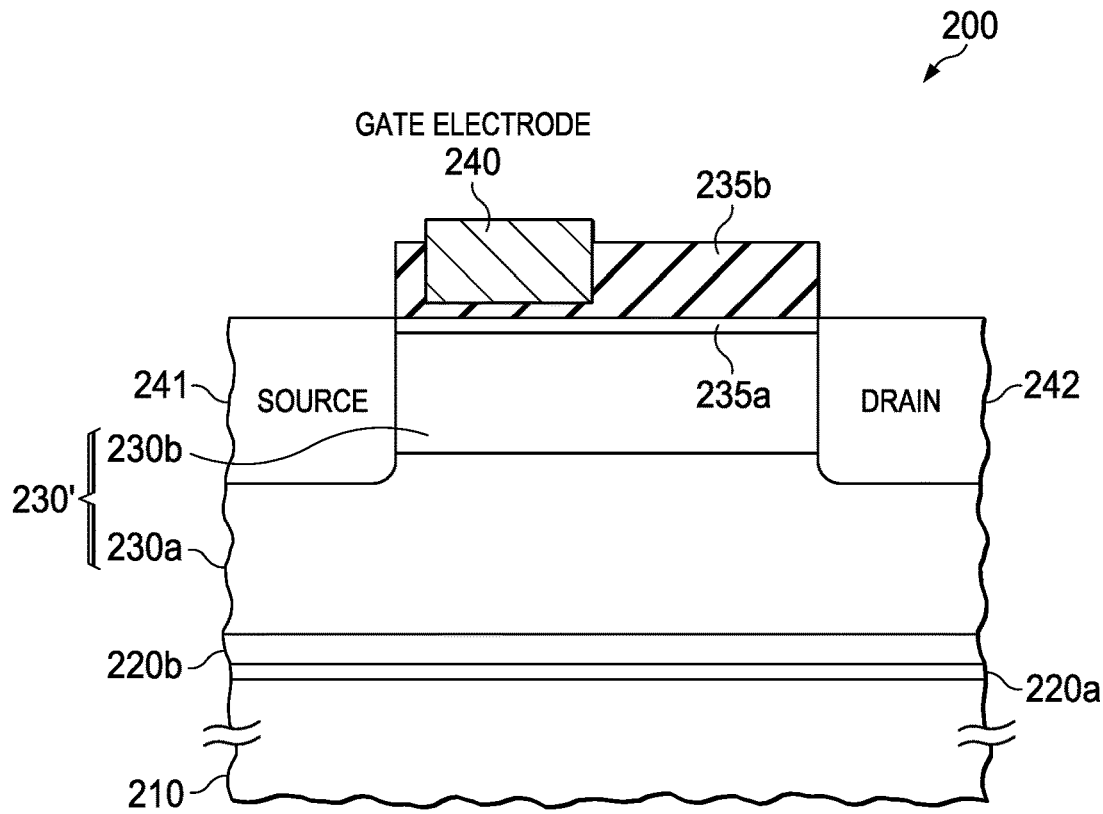
FIG. 2A is a cross sectional view of an example depletion-mode HEMT power device with a disclosed multi-layer gate dielectric stack on the Group IIIA-N layer on buffer layers being a bi-layer stack comprising a first Group IIIA-N layer on a second different Group IIIA-N layer, according to an example embodiment.

FIG. 2A is a cross sectional view of an example depletion-mode HEMT power device 200 with a disclosed multi-layer gate dielectric stack on a Group IIIA-N layer shown as 230' being an example bi-layer stack comprising a first Group IIIA-N layer 230b on a second different Group IIIA-N layer 230a, according to an example embodiment. The substrate is shown as 210. HEMT power device 200 is shown having a disclosed multi-layer gate dielectric stack comprising a first dielectric layer 235a being an oxide material having a thickness of >5 A, and a second dielectric layer 235b comprising silicon nitride or silicon oxynitride on the first dielectric layer 235a. HEMT power device 200 also has buffer layers including first buffer layer 220a on the substrate 210 and a second buffer layer 220b on the first buffer layer 220a.

HEMT power device 200 can be a discrete, device, or one of many devices on an IC. The first Group IIIA-N layer 230b is shown on a portion of the second Group IIIA-N layer 230a. Although the Group IIIA-N layer 230' is shown as a bi-layer', the Group IIIA-N layer 230' can be only a single layer, or three or more different Group IIIA-N layers.

Generally, the Group IIIA-N layer 230' may include one or more of GaN, InN, AlN, AlGaN, AlInN, InGaN, and AlInGaN. As noted above the Group IIIA-N layers can include other Group IIIA elements such as B, and N may be partially replaced by P, As, or Sb, and may also contain an optional dopant. In one specific example, the Group IIIA-N layer 230' comprises a GaN layer on top of an $Al_xGa_yN$ layer or an $In_xAl_yN$ layer.

The 2DEG of HEMT power device 200 is at the Group IIIA-N layer interface 230b/230a. In another embodiment the Group IIIA-N layer 230' can be more than two Group IIIA-N layers (e.g., 3-4 layers), such as each being an $Al_xGa_yN$ layer or $In_xAl_yN$ layer having a different value of x % and y %, where $0 \le x$, $y \le 1$ and $x+y=1$. A specific example is the Group IIIA-N layer 230' being a tri-layer stack comprising GaN on InAlN on AlGaN.

HEMT power device 200 includes a source 241, a drain 242, and a gate electrode 240. Gate electrode 240 is positioned between the source 241 and drain 242, closer to the source 241 than the drain 242. Although the gate electrode 240 is shown having an underlying multi-layer gate dielectric stack comprising a second dielectric layer 235b on a first dielectric layer 235a which physically and electrically separates the gate electrode 240 from the first Group IIIA-N layer 230b, the first Group IIIA-N layer 230b can instead be in direct contact with the underlying second IIIA-N layer 230a. The source 241, drain 242, and gate electrode 240 may be formed of metals and/or metal nitrides, but example embodiments are not limited thereto.

Figure 2B:
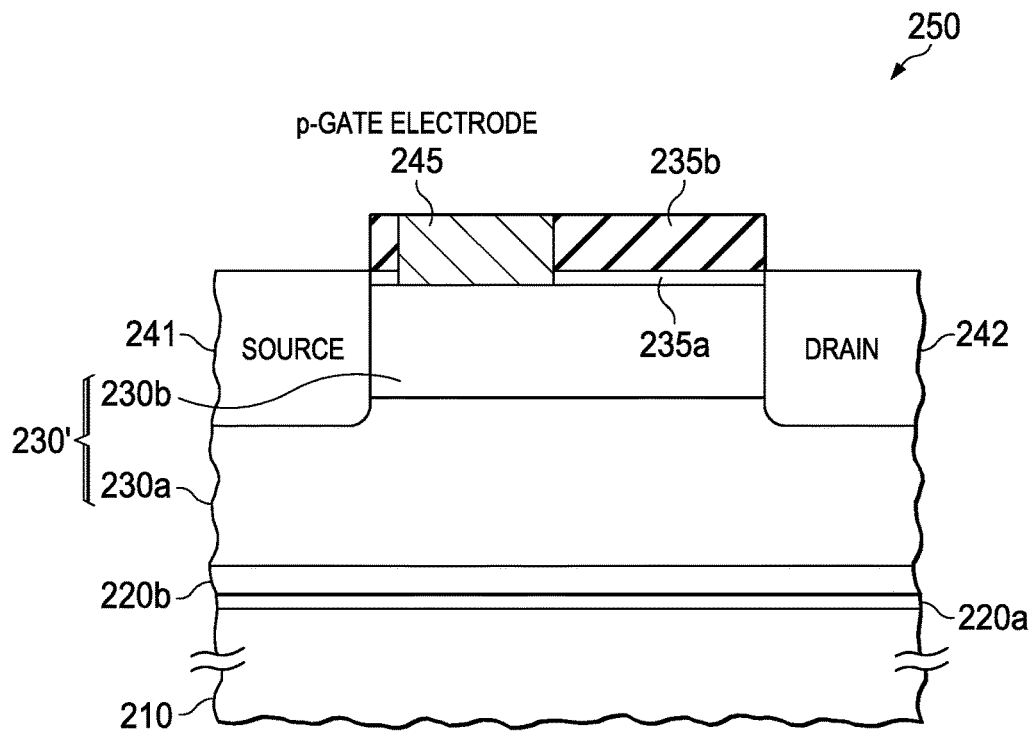
FIG. 2B is a cross sectional view of an example enhancement-mode HEMT power device with a normally off gate with a disclosed multi-layer gate dielectric stack on the Group IIIA-N layer on the buffer layers being a bi-layer stack comprising a first Group IIIA-N layer on a second different Group IIIA-N layer, according to an example embodiment.

FIG. 2B is a cross sectional view of an example enhancement-mode HEMT power device 250 with a normally off gate with a disclosed multi-layer gate dielectric stack comprising a second dielectric layer 235b on a first dielectric layer 235a on the Group IIIA-N layer shown as being a bi-layer stack comprising a first Group IIIA-N layer 230b on a second different Group IIIA-N layer 230a, according to an example embodiment. In this embodiment, the gate electrode is a p-doped gate electrode 245 that is in direct contact with the first Group IIIA-N layer 230b.

EXAMPLES

Disclosed embodiments are further illustrated by the following specific Examples, which should not be construed as limiting the scope or content of this Disclosure in any way.

Figure 3:
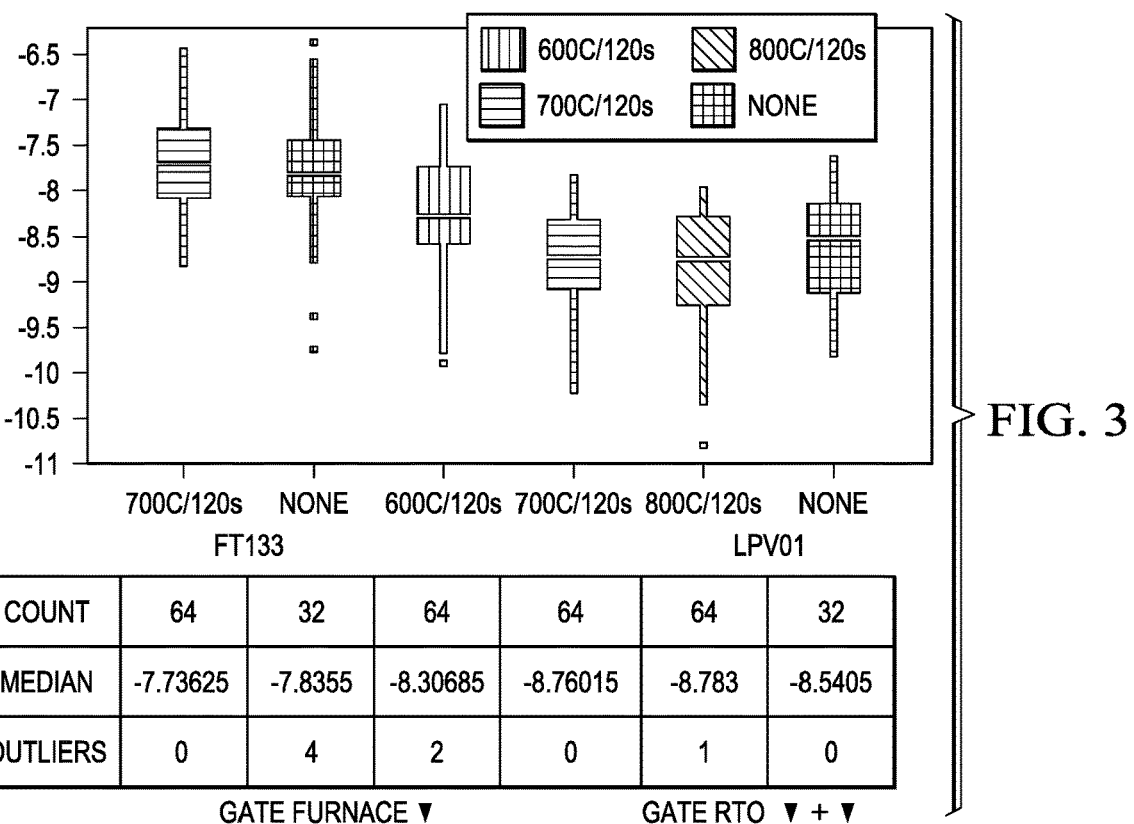
FIG. 3 is a plot of experimentally determined gate leakage for HEMT power transistors on various gate dielectrics, including control devices and devices with disclosed multi-layer gate dielectrics having thermal treated semiconductor/gate dielectric interfaces.

Test devices fabricated were HEMT power transistors with a gate electrode layer comprising TiW on various gate dielectrics, and their gate leakage was tested. FIG. 3 is a plot of experimentally determined gate leakage (in amps, collectively shown in the range from about 0.1 μA ($10^{-7}$ Amps) to 1 nA ($10^{-9}$ Amps)) for HEMT power transistors on various gate dielectrics, including control devices and devices with disclosed gate dielectrics having thermal treated semiconductor/gate dielectric interfaces.

The gate dielectrics for all test devices included 15 nm of SiN. Control devices had no lower dielectric layer ($2^{nd}$ and $6^{th}$ entry). Disclosed multi-layer gate dielectric stacks for test devices included lower in-situ dielectric layers formed in the LPCVD furnace used for the SiN deposition shown as "gate furnace" including 700° C. for 120 sec in oxygen to provide a gallium oxide layer about 1.5 nm thick and for 600° C. for 120 sec in oxygen to provide a gallium oxide layer about 1 nm thick. Test devices also included lower dielectric layers including a gate RTO 800° C. for 120 seconds to provide a gallium oxide layer about 2 nm, a gate RTO 700° C. for 120 sec to provide a gallium oxide layer about 1.5 nm, and a gate RTO 600° C. for 120 seconds to provide a gallium oxide layer about 1 nm thick. The test devices with the multi-layer gate dielectric stack having a gate dielectric formed by RTO 800° C. for 120 seconds can be seen to show the lowest gate leakage, with a reduction in leakage by about 1 order of magnitude (a factor of 10×).

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A method of fabricating a transistor device, comprising:
    thermally oxidizing a surface of a Group IIIA-N layer on a substrate to form a first dielectric layer comprising an oxide material extending from a source region to a drain region;
    depositing a second dielectric layer comprising a silicon nitride material on the first dielectric layer; and
    forming a metal gate electrode on the second dielectric layer and free of contacting the Group IIIA-N layer.

2. The method of claim 1, wherein the thermally oxidizing comprises performing a rapid thermal oxidation (RTO) or an in-situ oxidation.

3. The method of claim 1, wherein the depositing the second dielectric layer comprises performing a low pressure chemical vapor deposition (LPCVD) of the silicon nitride material.

4. The method of claim 1, further comprising:
    annealing, in a non-oxidizing ambient between 800° C. and 1100° C., after the depositing of the second dielectric layer and before the depositing of a metal gate material for the forming the metal gate electrode.

5. The method of claim 1, wherein the oxide material is selected from a group consisting of a gallium oxide, a silicon oxide, a silicon oxynitride, and combinations thereof.

6. The method of claim 1, wherein the oxide material comprises at least one or more of a GaOx material, a SiOx material, or a SiOxNy material, where $0 \leq x \leq 1$, $0 \leq y \leq 1$, $0 \leq x+y \leq 1$.

7. The method of claim 1, wherein the silicon nitride material is selected from a group consisting of a silicon nitride, a silicon oxynitride, and combinations thereof.

8. The method of claim 1, wherein the Group IIIA-N layer includes a material selected from a group consisting of a gallium nitride, an aluminum gallium nitride, and a combinations thereof.

9. A method of fabricating a transistor device, comprising:
    forming a Group IIIA-N layer above a substrate;
    forming a first dielectric layer on the Group IIIA-N layer, the first dielectric layer comprising an oxide material extending to a source region and to a drain region;
    forming a second dielectric layer on the first dielectric layer, the second dielectric layer comprising a nitride material; and
    forming a gate electrode formed on the second dielectric layer and free of contacting the Group IIIA-N layer, wherein the first dielectric layer and the second dielectric layer form a multi-layer gate dielectric stack that physically and electrically separates the gate electrode from the Group IIIA-N layer.

10. The method of claim 9, wherein the forming the Group IIIA-N layer includes epitaxially growing the Group IIIA-N layer onto the substrate.

11. The method of claim 9, wherein the forming the first dielectric layer includes thermally oxidizing a surface of the Group IIIA-N layer to have an oxide thickness greater than 5 Å.

12. The method of claim 9, wherein forming the first dielectric layer comprises performing a rapid thermal oxidation (RTO) or an in-situ oxidation.

13. The method of claim 9, wherein the forming the second dielectric layer includes performing a low pressure chemical vapor deposition (LPCVD) of the nitride material.

14. The method of claim 9, further comprising:
    annealing, in a non-oxidizing ambient between 800° C. and 1100° C., after the depositing of the second dielectric layer and before the depositing of a metal gate material for the forming the gate electrode.

15. The method of claim 11, wherein the nitride material is selected from a group consisting of a silicon nitride, a silicon oxynitride, and combinations thereof.

16. The method of claim 11, wherein the Group IIIA-N layer includes a material selected from a group consisting of a gallium nitride, an aluminum gallium nitride, and a combinations thereof.

17. A method of fabricating a transistor device, comprising:
    forming a GaN layer over a substrate;
    forming an AlGaN layer on the GaN layer, the AlGaN layer and GaN layer forming a heterojunction;
    thermally oxidizing a surface of the AlGaN layer to form a first dielectric layer comprising an oxide material extending from a source region to a drain region;
    depositing a second dielectric layer on the first dielectric layer, the second dielectric layer comprising a nitride material; and
    forming a gate electrode formed on the second dielectric layer and free of contacting the AlGaN layer, wherein the first dielectric layer and the second dielectric layer form a multi-layer gate dielectric stack that physically and electrically separates the gate electrode from the AlGaN layer.

18. The method of claim 17, wherein the oxide material is selected from a group consisting of a gallium oxide, a silicon oxide, a silicon oxynitride, and combinations thereof.

19. The method of claim 17, wherein the oxide material comprises at least one or more of a GaOx material, a SiOx material, or a SiOxNy material, where $0 \leq x \leq 1$, $0 \leq y \leq 1$, $0 \leq x+y \leq 1$.

* * * * *